United States Patent
Chiang et al.

(10) Patent No.: US 7,633,316 B2
(45) Date of Patent: *Dec. 15, 2009

(54) TRANSMISSION GATE MULTIPLEXER

(75) Inventors: Owen Chiang, Austin, TX (US);
Christopher M. Durham, Round Rock, TX (US); Peter J. Klim, Austin, TX (US); Robert N. Krentler, Austin, TX (US); James D. Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/256,582

(22) Filed: Oct. 23, 2008

(65) Prior Publication Data

US 2009/0072863 A1     Mar. 19, 2009

Related U.S. Application Data

(63) Continuation of application No. 11/854,604, filed on Sep. 13, 2007, now Pat. No. 7,466,165.

(51) Int. Cl.
*H03K 19/20*     (2006.01)
(52) U.S. Cl. .................... 326/113; 326/104
(58) Field of Classification Search ................. 326/104, 326/112–114
See application file for complete search history.

(56) References Cited

U.S. PATENT DOCUMENTS

| | | | |
|---|---|---|---|
| 5,789,966 | A | 8/1998 | Bechade |
| 5,991,208 | A | 11/1999 | Aipperspach et al. |
| 7,002,860 | B2 | 2/2006 | Chu et al. |
| 7,171,636 | B2 | 1/2007 | Sako |
| 7,191,205 | B2 | 3/2007 | Nakaya |
| 2007/0001733 | A1 | 1/2007 | Branch et al. |

*Primary Examiner*—Don P Le
(74) *Attorney, Agent, or Firm*—Dillon & Yudell LLP

(57) ABSTRACT

A technique for operating a multiplexer includes selecting, from multiple transmission gate groups, a transmission gate group. A transmission gate is selected from the selected transmission gate group. Finally, a data signal associated with the selected transmission gate is provided at an output of the multiplexer.

12 Claims, 6 Drawing Sheets

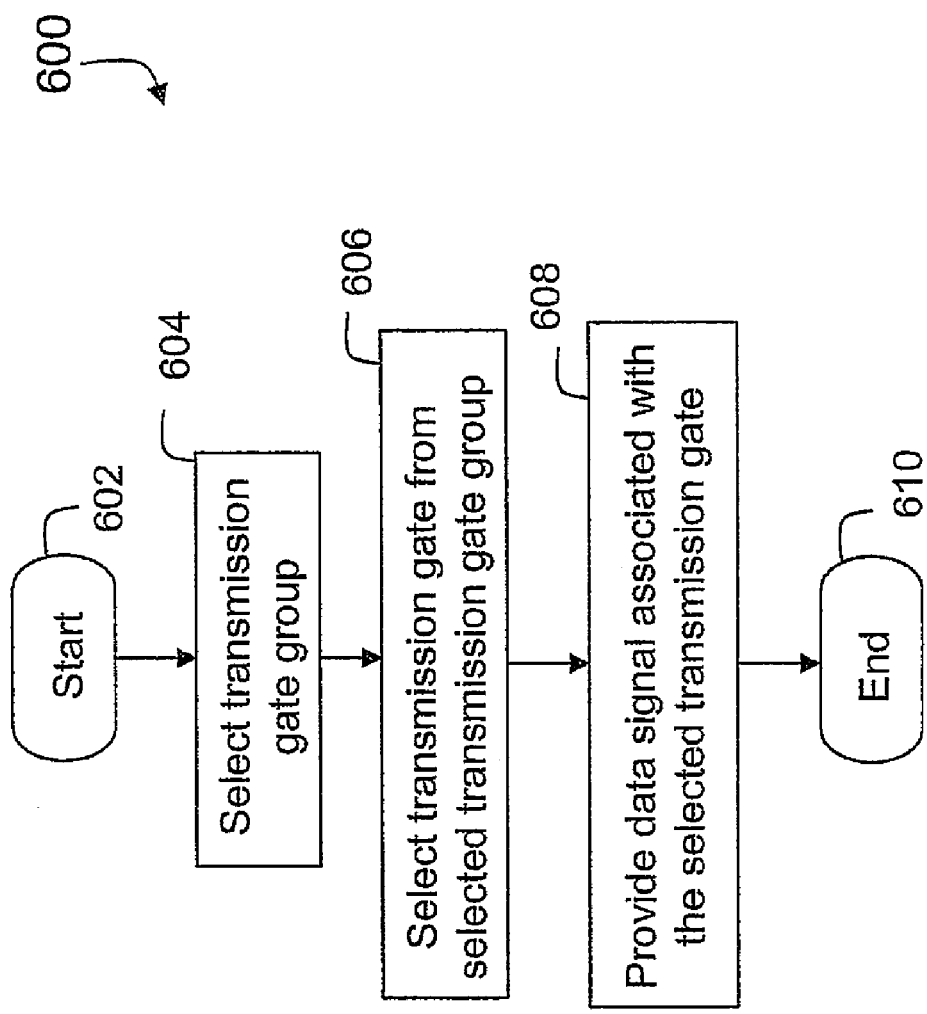

TRANSMISSION GATE MULTIPLEXER

CROSS REFERENCE TO RELATED APPLICATION

The present application is a continuation of U.S. patent application Ser. No. 11/854,604 (now U.S. Pat. No. 7,466,165), filed on Sep. 13, 2007 and entitled, "Transmission Gate Multiplexer," the contents of which is incorporated by reference herein in its entirety and for all purposes.

BACKGROUND

1. Field

This disclosure relates generally to a multiplexer and, more specifically, to a transmission gate multiplexer.

2. Related Art

As is known, a transmission gate typically includes a parallel combination of an n-channel metal-oxide semiconductor field-effect transistor (MOSFET) and a p-channel MOSFET. An input at a gate of one of the MOSFETs is complementary to an input at a gate of the remaining MOSFET. That is, when an input to a gate of the n-channel MOSFET is a digital zero '0', an input to a gate of the p-channel MOSFET is a digital one '1'. In this case, both of the MOSFETs are turned off and an input of the transmission gate is not connected to an output of the transmission gate. Similarly, when the gate input to the n-channel MOSFET is a digital one '1', the gate input to the p-channel MOSFET is a digital zero '0'. In this case, both of the MOSFETs are turned on and an input signal at an input of the transmission gate is passed by the transmission gate to an output of the transmission gate. In general, the utilization of a transmission gate essentially eliminates undesirable threshold voltage effects that may result in loss of logic levels (irrespective of a logic level, i.e., one '1' or zero '0', of an input signal).

As is also known, a multiplexer is an electronic device that includes multiple inputs and a single output. A multiplexer selects a single one of multiple data sources, which are each coupled to respective inputs of the multiplexer, and provides the selected data source on a single output of the multiplexer. In high-speed circuit design applications, multiplexers have typically utilized transmission gates. In general, conventional multiplexers that have employed transmission gates have exhibited decreased latency, as compared to conventional multiplexers that have implemented NAND-NAND or AND-OR-Invert (AOI) gate structures. However, in conventional multiplexers that have employed transmission gates, as the number of multiplexer inputs has increased, a diffusion capacitance at a common output node of the transmission gates has also increased. When the diffusion capacitance reaches a threshold level, a signal speed at the common output node of the multiplexer has decreased to a point that cancels an increase provided by utilizing transmission gates. Unfortunately, in order to reduce logic stages, reduce latency, and to minimize macro or chip area, it is often desirable to create wide multiplexers. Another downside to increasing a width of a multiplexer is that a select circuit load is also increased. Moreover, as noted above, in multiplexers that employ transmission gates, increasing a width of the multiplexer has caused a common output node of the transmission gates to become more heavily loaded, as additional transmission gates are added to the multiplexer (i.e., as the number of multiplexer inputs is increased).

With reference to FIG. 1, a relevant portion of a conventional 8:1 multiplexer 100 is depicted that includes eight select signals (i.e., sel0 through sel7) that are employed to select one data signal (i.e., one of data signals din0 through din7). The conventional multiplexer 100 includes eight transmission gates 104 whose outputs are coupled to a common output node 106, which is coupled to an input of an inverter 108. Due to the number of the transmissions gates 104 coupled to the common output node 106, the multiplexer 100 may exhibit a relatively large diffusion capacitance, as well as a relatively large leakage current. Turning to FIG. 2, a select circuit 200 is depicted that provides the select signals for the multiplexer 100. The select circuit 200 receives a three-bit binary coded select signal (including bits b0, b1, and b2) that is decoded to provide an appropriate one of the select signals (i.e., sel0 through sel7). As is shown, the select circuit 200 employs two inverters 202 for each of the three-bit binary coded select signals. Signals provided by the inverters 202 are provided to appropriate inputs of three-input NAND gates 204, whose outputs are provided to respective inverters 206.

SUMMARY

According to one aspect of the present disclosure, a multiplexer includes first NAND gates, first transmission gates, second NAND gates, second transmission gates, and a third NAND gate. The first NAND gates each include a first input configured to receive a first group select signal and a second input configured to receive a respective first data signal. The first transmission gates each including an input coupled to an output of one of the first NAND gates and a first select input configured to receive a respective first select signal. The second NAND gates each include a first input configured to receive a second group select signal and a second input configured to receive a respective second data signal. The second transmission gates each include an input coupled to an output of one of the second NAND gates and a second select input configured to receive a respective second select signal. The third NAND gate includes a first input coupled to an output of each of the first transmission gates and a second input coupled to an output of each of the second transmission gates. An output of the third NAND gate is configured to provide one of the respective first or second data signals responsive to the respective first and second select signals.

According to another aspect of the present disclosure, a technique for operating a multiplexer includes selecting, from multiple transmission gate groups, a transmission gate group. A transmission gate is selected from the selected transmission gate group. Finally, a data signal associated with the selected transmission gate is provided at an output of the multiplexer.

According to one embodiment of the present disclosure, a computer system includes a memory subsystem and a processor that is coupled to the memory subsystem. The processor includes a multiplexer that is configured to select, from multiple transmission gate groups, a transmission gate group. The multiplexer is also configured to select, from the selected transmission gate group, a transmission gate and provide, at an output of the multiplexer, a data signal associated with the selected transmission gate.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

FIG. 6 is a flowchart of an example process for operating a multiplexer according to an embodiment of the present disclosure.

DETAILED DESCRIPTION

Figure 1:
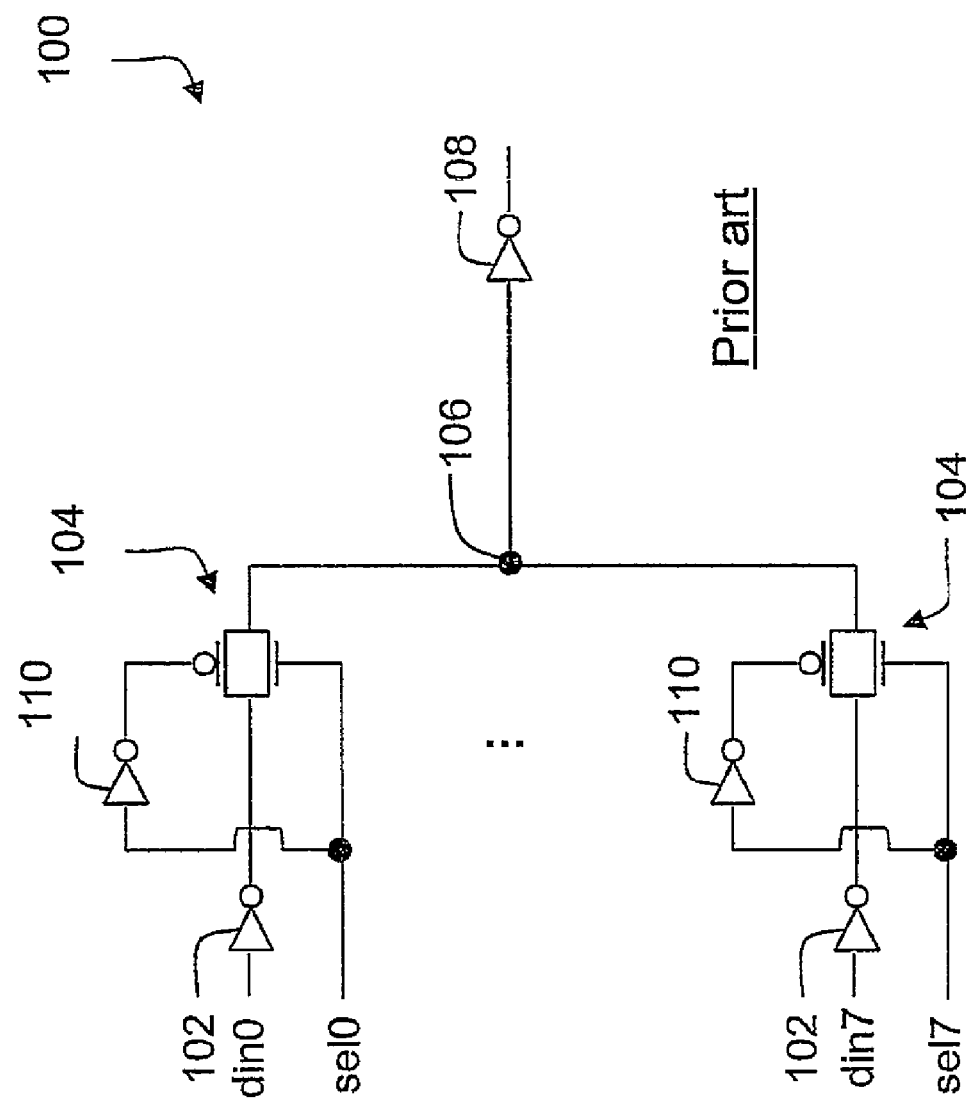
FIG. 1 is an electrical block diagram of a relevant portion of an example conventional multiplexer that employs transmission gates.
Figure 2:
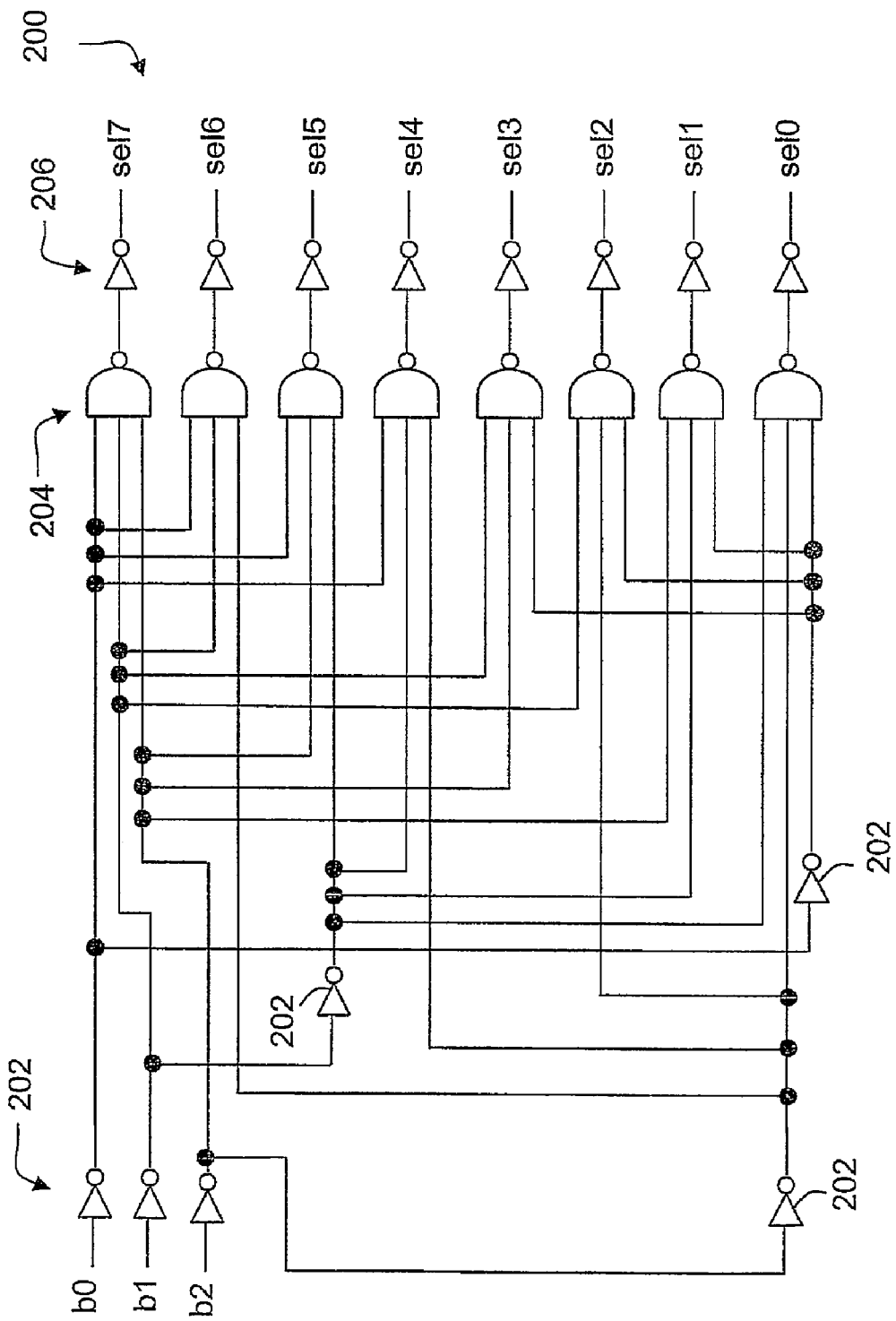
FIG. 2 is an electrical block diagram of an example conventional select circuit for the multiplexer of FIG. 1.

As will be appreciated by one of ordinary skill in the art, the present invention may be embodied as a method, system, device, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." For example, the present invention may take the form of one or more design files included in a computer program product on a computer-usable storage medium having computer-usable program code embodied in the medium.

Any suitable computer-usable or computer-readable storage medium may be utilized. The computer-usable or computer-readable storage medium may be, for example, but is not limited to an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. Note that the computer-usable or computer-readable storage medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this disclosure, a computer-usable or computer-readable storage medium may be any medium that can contain or store a program for use by or in connection with an instruction execution system, apparatus, or device. As used herein, the term "coupled" includes both a direct electrical connection between blocks or components and an indirect electrical connection between blocks or components achieved using intervening blocks or components.

According to various aspects of the present disclosure, performance of a multiplexer that employs transmission gates is improved through the modification of input and output gate types and a select circuit. According to various embodiments, a multiplexer is disclosed herein that employs a two-input NAND gate to source two groups of transmission gates. According to simulations, an 8:1 transmission gate multiplexer (or multiplexer that includes transmission gates), configured according to various aspects of the present disclosure, has about one-half the diffusion capacitance and is approximately twenty percent faster than the conventional 8:1 multiplexer illustrated in FIG. 1. In general, the disclosed techniques isolate transmission gates of a multiplexer into multiple groups (e.g., 2, 3, or 4 groups) to reduce a diffusion (output load) capacitance of the multiplexer. While select circuit loading may generally be increased by the techniques disclosed herein, the increase in select circuit loading may be addressed by employing copies of select signals (e.g., employing each of the select signals in each of the transmission gate groups to select a transmission gate within one of the transmission gate groups) and employing a minimum size local inverter (not separately shown in FIG. 3 (see inverters 110 of FIG. 1)) with each transmission gate to minimize loading. Various layout techniques may also be employed to minimize a wire load on the common output node.

Figure 3:
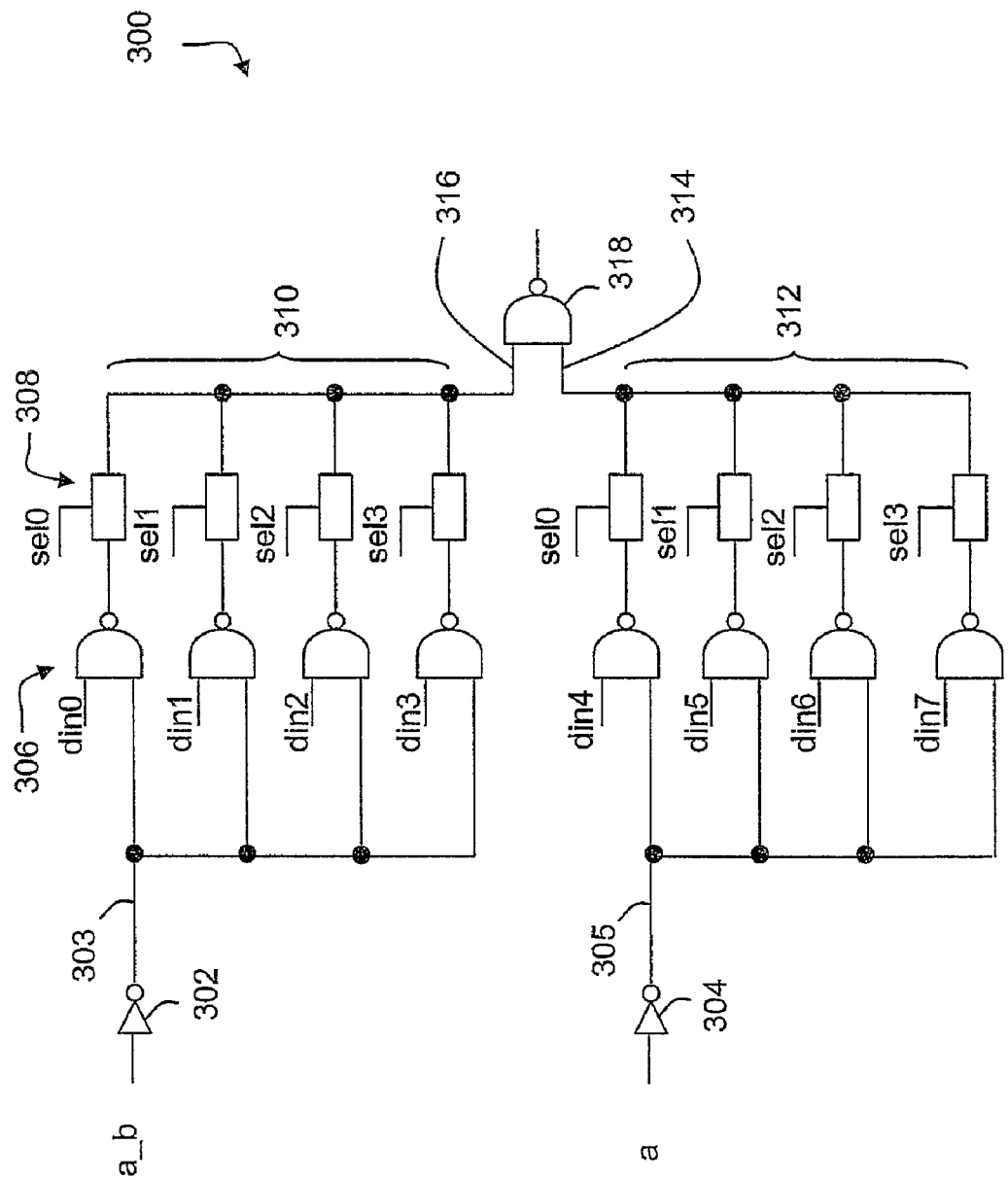
FIG. 3 is an electrical block diagram of an example multiplexer that employs transmission gates and is configured according to the present disclosure.

With reference to FIG. 3, a multiplexer 300 employs a two-input NAND gate 306 in place of each of the input inverters 102 of the multiplexer 100 of FIG. 1. In FIG. 3, eight transmission gates 308 are grouped into two groups of four transmission gates. It should be appreciated that the techniques disclosed herein are applicable to multiplexers that have transmission gates grouped into two or more groups with two or more transmission gates in each group. A first term 'a' (associated with one of three terms (b0, b1, and b2 of FIG. 4) of a three-bit binary coded select signal) is routed to a first transmission gate group 312 that includes four of the transmission gates 308. The first term 'a' provides a first group select signal at node 305. A second term 'a_b', which is a complement of the first term 'a', is routed to a second transmission gate group 310 that includes a remaining four of the transmission gates 308. The second term 'a_b' provides a second group select signal at node 303. A first common output node 314 of the transmission gates 308 that are in the group 312 are routed to a first input of a two-input NAND gate 318 and a second common output node 316 of the transmission gates 308 that are in the group 310 are routed to a second input of the two-input NAND gate 318. As not all of the transmission gates 308 terminate into a same input of the NAND gate 318, a diffusion capacitance on the output node of the multiplexer 300 is essentially reduced (in this case by a factor of about two). While a propagation delay of the NAND gate 318 is higher than propagation delay of the inverter 108 of the multiplexer 100 of FIG. 1, the gain in performance due to lowered diffusion capacitance offsets the increase in propagation delay and, in fact, lowers the propagation delay.

Figure 4:
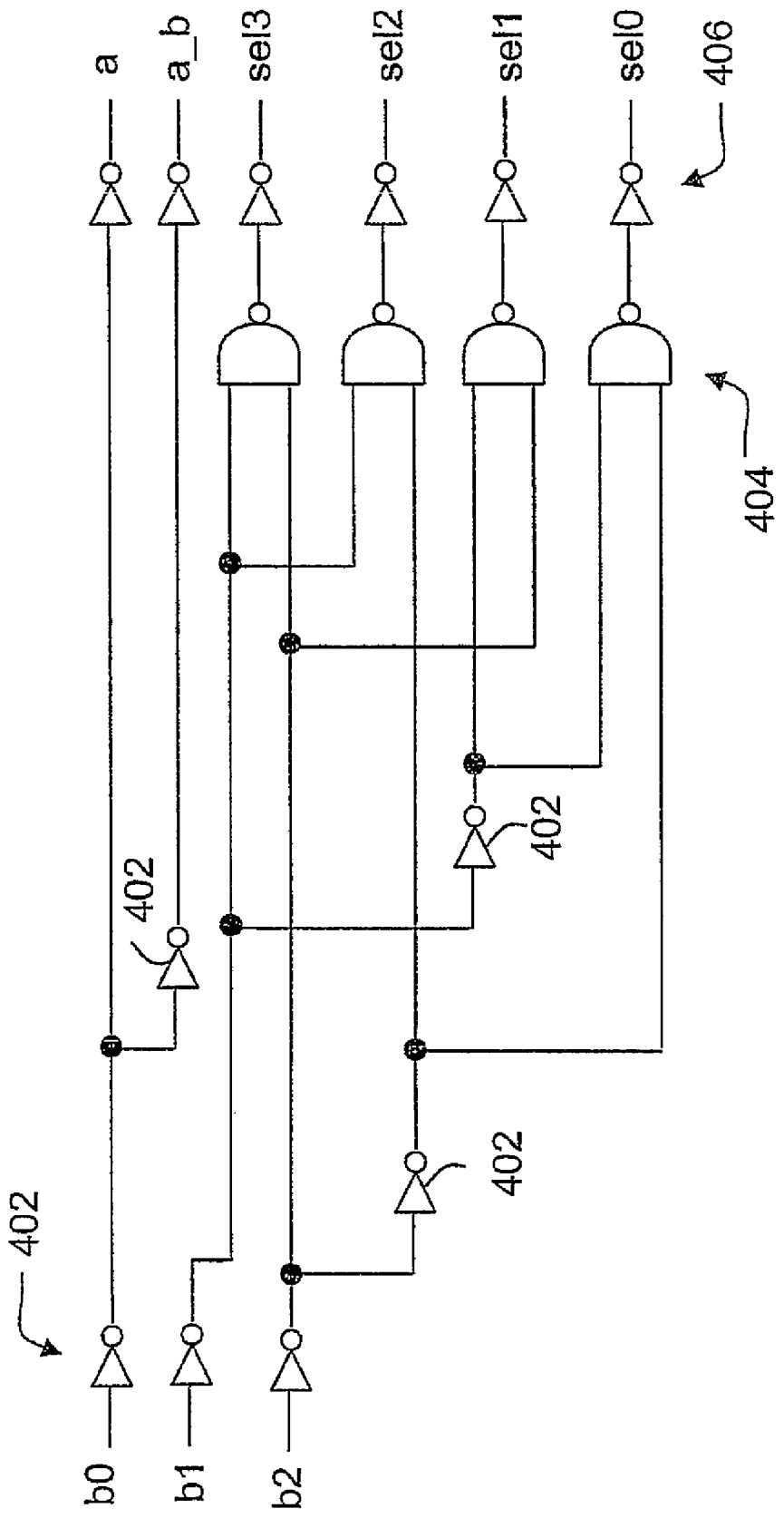
FIG. 4 is an electrical block diagram of an example select circuit for the multiplexer of FIG. 3.

Moving to FIG. 4, a select circuit 400 is depicted that provides select signals for the multiplexer 300. The select circuit 400 receives the three-bit binary coded select signal (including bits b0, b1, and b2) which is decoded to provide an appropriate one of the select signals (i.e., sel0 through sel3). As is shown, the select circuit 400 employs two input inverters 402 for each of the three-bit binary coded select signals. For one bit (b0) of the three-bit binary coded select signal, signals provided by associated ones of the inverters 402 are directly provided to appropriate inputs of associated ones of inverters 406. For the remaining two bits (b1 and b2) of the three-bit binary coded select signal, signals provided by associated ones of the inverters 402 are provided to appropriate inputs of two-input NAND gates 404, whose outputs are provided to appropriate inputs of associated ones of the inverters 406. It should be appreciated that the select circuit 400 offers a performance increase over the select circuit 200, as the number of terms to be decoded drops by a factor of two. Moreover, two-input NAND gates offer a performance improvement over three-input NAND gates. In the select circuit 400 of FIG. 4, the worst propagation delay corresponds to the delay through three inverters and a two-input NAND (NAND2) gate (i.e., inverter-inverter-NAND2-inverter).

Figure 5:
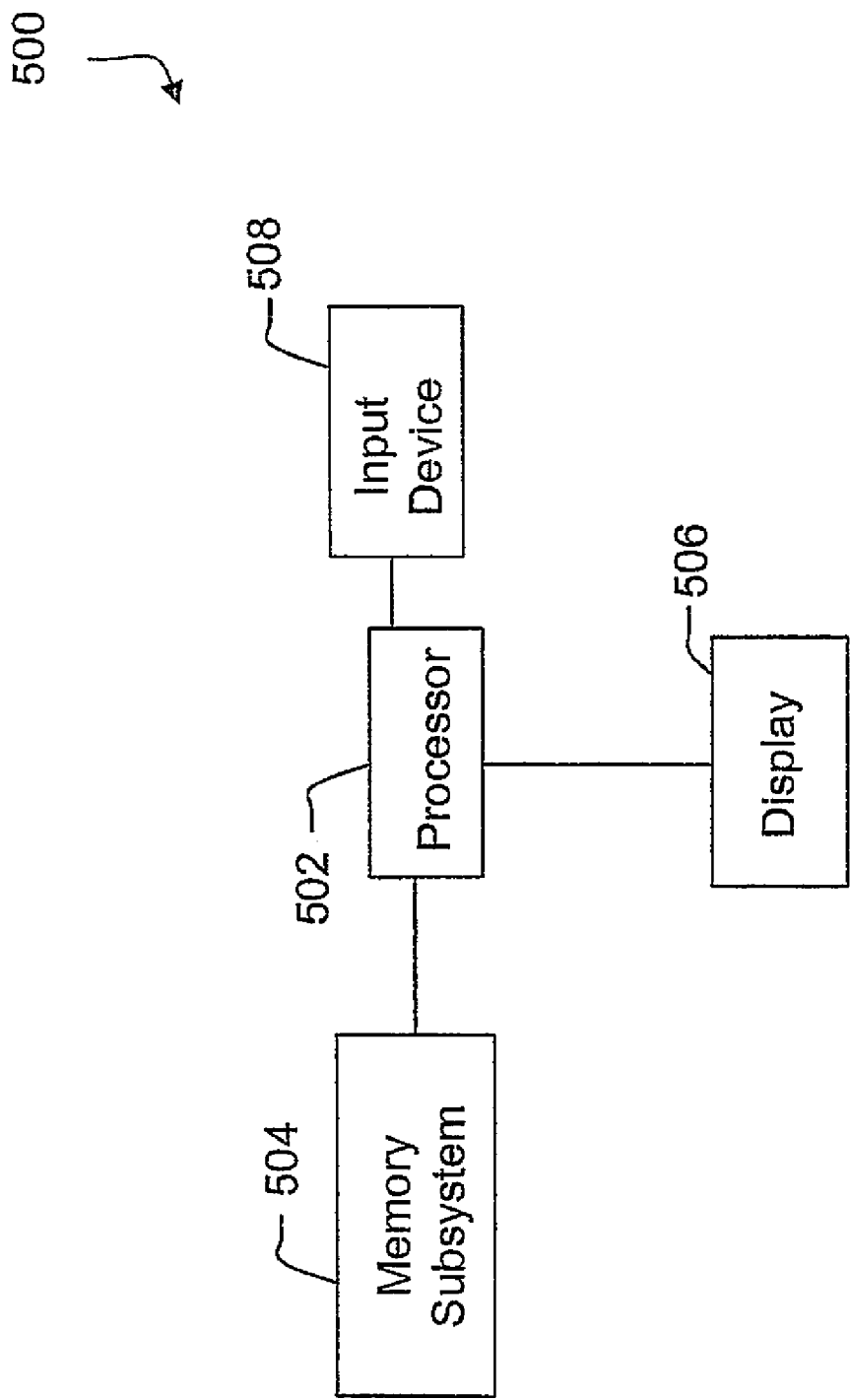
FIG. 5 is a block diagram of an example computer system that may be configured to include one or more multiplexers configured according to FIG. 3.

With reference to FIG. 5, an example computer system 500 is illustrated that may include one or more circuits that employ one or more multiplexers configured according to various embodiments of the present disclosure. The computer system 500 includes a processor 502 that is coupled to a memory subsystem 504, a display 506, and an input device 508. The processor 502 may include one or more multiplexers configured according to the present disclosure. The memory subsystem 504 normally includes an application appropriate amount of volatile memory (e.g., dynamic random access memory (DRAM)) and non-volatile memory (e.g., read-only memory (ROM)). The display 506 may be, for example, a cathode ray tube (CRT) or a liquid crystal display (LCD). The input device 508 may include, for example, a mouse and a keyboard. The processor 502 may also be coupled to one or more mass storage devices, e.g., a compact disc read-only memory (CD-ROM) drive.

With reference to FIG. 6, an example process 600 for operating a multiplexer, according to an embodiment of the present disclosure, is illustrated. In block 602, the process 600 is initiated at which point control transfers to block 604. In block 604, a transmission gate group is selected based on first and second group select signals (e.g., 'a' and 'a_b' signals) provided by the select circuit 400. Next, in block 606, a transmission gate is selected from the selected transmission gate group, based on select signals (sel0 through sel3) provided by the select circuit 400. Then, in block 608, the multiplexer 300 provides a data signal associated with the selected transmission gate at the output of the two-input NAND gate 318. Following block 608, control transfers to block 610, where the process 600 terminates until a provided binary coded select signal causes the select circuit 400 to select a different input of the multiplexer 300.

Accordingly, techniques have been disclosed herein that readily facilitate the construction of a transmission gate multiplexer having a relatively low output capacitance. While the disclosed example is directed to an 8:1 multiplexer, it should be appreciated that the techniques herein are broadly applicable to multiplexers that have more or less than eight inputs (and correspondingly more or less than three-bit binary coded select signals).

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A multiplexer, comprising:
   first NAND gates each including a first input configured to receive a first group select signal and a second input configured to receive a respective first data signal;
   first transmission gates each including an input coupled to an output of one of the first NAND gates and a first select input configured to receive a respective first select signal;
   second NAND gates each including a first input configured to receive a second group select signal and a second input configured to receive a respective second data signal;
   second transmission gates each including an input coupled to an output of one of the second NAND gates and a second select input configured to receive a respective second select signal; and
   a third NAND gate including a first input coupled to an output of each of the first transmission gates and a second input coupled to an output of each of the second transmission gates.

2. The multiplexer of claim 1, where the first and second NAND gates are two-input NAND gates.

3. The multiplexer of claim 1, where the first, second, and third NAND gates are two-input NAND gates.

4. The multiplexer of claim 2, wherein the first and second transmission gates each include four transmission gates.

5. The multiplexer of claim 2, wherein the first and second transmission gates each include two transmission gates.

6. The multiplexer of claim 1, further comprising:
   a select circuit configured to provide the first and second group select signals.

7. The multiplexer of claim 6, wherein the select circuit is further configured to provide the respective first and second select signals, wherein each of the respective second select signals correspond to one of the respective first select signals.

8. A computer system, comprising:
   a memory subsystem; and
   a processor coupled to the memory subsystem, wherein the processor includes a multiplexer that is configured to:

select, from multiple transmission gate groups, a transmission gate group by enabling respective multiple-input NAND gates associated with respective transmission gates within the selected transmission gate group;

select, from the selected transmission gate group, a transmission gate; and provide, at an output of the multiplexer, a data signal associated with the selected transmission gate.

9. The computer system claim 8, wherein the multiplexer is further configured to:

provide, at the output of the multiplexer, the data signal associated with the selected transmission gate by enabling a multiple-input NAND gate that has a first input coupled to outputs of first transmission gates included in a first one of the multiple transmission gate groups and a second input coupled to outputs of second transmission gates included in a second one of the multiple transmission gate groups.

10. The computer system of claim 8, wherein the multiplexer is further configured to:

provide respective first select signals to respective first transmission gates within a first transmission gate group; and provide respective second select signals to respective second transmission gates within a second transmission gate group, wherein the respective second select signals are copies of the respective first select signals.

11. The computer system claim 8, wherein the multiplexer includes eight inputs and one output.

12. The computer system claim 9, wherein the multiple-input NAND gate includes two-inputs and the multiple transmission gate groups each include two transmission gates.

* * * * *